(12) United States Patent
Khalili (10) Patent No.: US 8,729,931 B1
(45) Date of Patent: May 20, 2014

(54) DIVIDE-BY-TWO DIVIDER CIRCUIT HAVING BRANCHES WITH STATIC CURRENT BLOCKING CIRCUITS

(71) Applicant: QUALCOMM Incorporated, San Diego, CA (US)

(72) Inventor: Alireza Khalili, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/757,653

(22) Filed: Feb. 1, 2013

(51) Int. Cl.
*H03K 21/00* (2006.01)
(52) U.S. Cl.
USPC .......................................... 327/115; 327/118
(58) Field of Classification Search
USPC ......................................................... 327/115
See application file for complete search history.

(56) References Cited

U.S. PATENT DOCUMENTS

| | | | |
|---|---|---|---|
| 6,466,069 B1 | 10/2002 | Rozenblit et al. | |
| 6,947,514 B1 | 9/2005 | Kato et al. | |
| 2005/0189970 A1 | 9/2005 | Nakatake et al. | |
| 2012/0081156 A1* | 4/2012 | Hesen et al. | 327/115 |
| 2012/0252393 A1 | 10/2012 | Xie et al. | |

FOREIGN PATENT DOCUMENTS

WO 2011072081 6/2011

OTHER PUBLICATIONS

Razavi et al., "Design of High-Speed, Low-Power Frequency Dividers and Phase-Locked Loops in Deep Submicron CMOS", IEEE Journal of Solid-State Circuits, vol. 30, No. 2, Feb. 1995, pp. 101-109.
Wang, HongMo, "A 1.8V 3mW 16.8GHz Frequency Divider in 0.25um CMOS", 2000 IEEE International Solid State Circuits Conference, year 2000, 2 pages.
Yuan et al., "High-Speed CMOS Circuit Technique", IEEE Journal of Solid-State Circuits, vol. 24, No. 1, Feb. 1989, pp. 62-70.

* cited by examiner

*Primary Examiner* — Daniel Rojas
(74) *Attorney, Agent, or Firm* — Arent Fox LLP (57) ABSTRACT

A divide-by-two divider circuit receives a differential input signal and outputs four rail-to-rail, twenty-five percent duty cycle signals, where the frequency of the output signals is half of the frequency of the input signal. Each latch can output its output signals into loads of at least 15 fF at a frequency of at least 3 GHz so that each output signal has a phase noise of better than 160 dBc/Hz, while the latch consumes less than 0.7 mW over PVT from a supply voltage less than 1.0 volt. Each latch has a cross-coupled pair of P-channel transistors and two output signal generating branches. A static current blocking circuit in each branch prevents current flow in the branch during times when the branch is not switching its output signal. The input node of the latch is capacitively coupled to a signal source, and the DC voltage on the node is set by a bias circuit.

25 Claims, 10 Drawing Sheets

|  | DIVIDER OF FIG. 5 | DIVIDER OF FIG. 1 (PRIOR ART) |
|---|---|---|
| DIVIDER SUPPLY CURRENT (mA) LATCH SUPPLY CURRENT IS ABOUT HALF THIS. | 1.5mA • | 3.7mA • |
| MIN SUPPLY VOLTAGE (VOLTS) | ~0.85V | ~1.0V ✱ |
| DIVIDER POWER CONSUMPTION (mW) | < 1.3mW | ~3.7mW |
| LATCH POWER CONSUMPTION (mW) | < 0.65mW | ~1.85mW |
| NOISE (PHASE NOISE AT 100MHz) | 162dBc/Hz | 160dBc/Hz |
| SPEED (RISE/FALL TIMES IN ps) | 40ps | 50ps |
| SWING OF OUTPUT SIGNALS | RAIL-TO-RAIL | RAIL-TO-RAIL |
| DUTY CYCLE OF OUTPUT SIGNALS | ~25% (ACTIVE LOW) | ~25% (ACTIVE HIGH) |
| COUPLING TO VCO | AC WITH BIAS CONTROL | DIRECT CONNECT |
| SENSITIVITY TO PVT VARIATIONS | LESS SENSITIVE | MORE SENSITIVE |

(FOR A 3GHZ DIFFERENTIAL INPUT CLOCK)
(ASSUMING EACH DIVIDER DRIVES FOUR 20fF LOADS)
(ASSUMING THE DIVIDERS ARE MADE FROM COMPARABLE TRANSISTOR SIZES AND PROCESSES)
(✱ CANNOT BE LOWER THAN 1.0V IF SUPPLY CURRENT CANNOT BE MORE THAN 3.7mA OVER PVT)
(• MAX SUPPLY CURRENT OVER PVT WHEN OPERATED AT THE INDICATED SUPPLY VOLTAGE)

COMPARISON OF DIVIDER OF FIG. 3 WITH PRIOR ART OF FIG. 1

DIVIDE-BY-TWO DIVIDER CIRCUIT HAVING BRANCHES WITH STATIC CURRENT BLOCKING CIRCUITS

BACKGROUND INFORMATION

1. Technical Field

The disclosed embodiments relate generally to divide-by-two divider circuits.

2. Background Information

In one type of RF receiver such as might be found in a cellular telephone, a crystal oscillator outputs a high quality reference clock signal. The reference clock signal from the crystal has low frequency drift and has low clock edge jitter. A Phase-Locked Loop (PLL) circuit receives this reference clock signal and generates therefrom a higher frequency VCO output signal. The VCO output signal has a programmable frequency that is tunable in a tunable range (for example, from 1 GHz to 3 GHz). The best Voltage-Controlled Oscillators (VCOs) in terms of being low phase noise VCOs for use in such PLLs generally output sinusoidal differential signals. This type of low-noise VCO is therefore used. The mixer that performs downconversion in the receive chain of the receiver may, however, be best driven using I and Q quadrature signals, where each of the quadrature signals has a low duty cycle (for example, a 25% duty cycle). A divide-by-two divider circuit is therefore sometimes employed to receive the sinusoidal differential output signal from the VCO and to generate therefrom the low duty cycle I and Q signals for the mixer.

There are, however, many different types of divide-by-two divider circuits that might be employed. Each type of divide-by-two divider circuit has some more desirable qualities and has other less desirable qualities. The determination of what type of divide-by-two divider to use generally involves trade-offs depending on the application. Ideally, in one particular cellular telephone receiver application, the divider-by-two divider should: generate low duty cycle I and Q signals, consume only a small amount of power, output I and Q signals that have short rise and fall times, introduce only minimal noise jitter into the I and Q output signals, operate from a low supply voltage as low as 1.0 volts, and output I and Q signals that transition from rail to rail.

Figure 1:
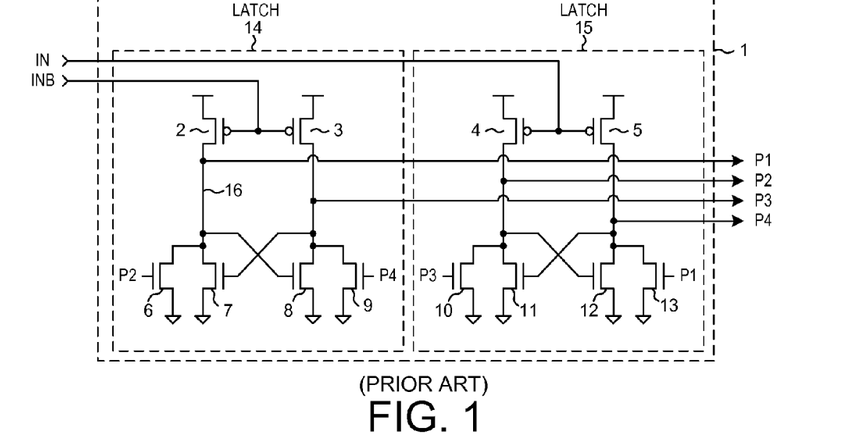
FIG. 1 (Prior Art) is a diagram of a divide-by-two divider circuit referred to as Razavi divider.

FIG. 1 (Prior Art) is a diagram of a divide-by-two divider 1 referred to here as a Razavi divider. For additional information on a Razavi divider, see: "Design of High-Speed, Low-Power Frequency Dividers and Phase-Locked Loops In Deep Submicron CMOS", by Behzad Razavi et al., IEEE Journal of Solid-State Circuits, Vol. 30, No. 2, pages 101-109, February 1995. The Razavi divider 1 involves P-channel transistors 2-5 and N-channel transistors 6-13. The Razavi divider outputs low duty cycle (25%) I and Q signals, and is relatively fast, and outputs rail-to-rail signals, but the Razavi divider consumes an undesirably large amount of power and introduces more phase noise into the output signals I and Q than is desired. Moreover, it is generally difficult to implement such a Razavi divider that operates reliably over process and temperature from a low 1.0 volt supply voltage.

The Razavi divider 1 of FIG. 1 includes a first latch 14 on the left, and a second latch 15 on the right. The two latches 14 and 15 are interconnected as shown. The divider receives a differential signal IN and INB, and outputs four single-ended signals P1, P2, P3 and P4. The frequency of each of the single-ended output signals P1, P2, P3 and P4 is of half the frequency of the differential input signal IN and INB.

Figure 2:
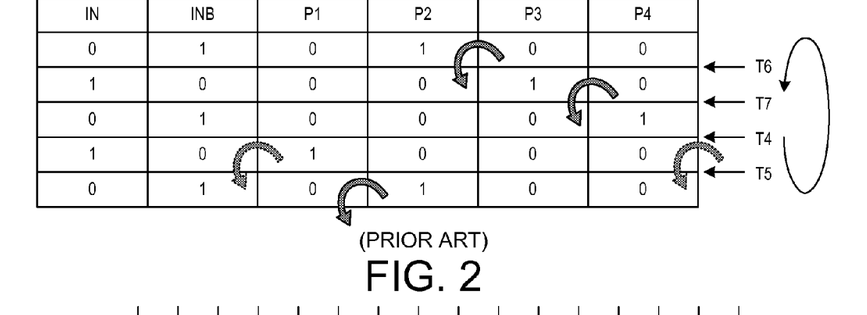
FIG. 2 (Prior Art) is a table that sets forth an operation of the Razavi divider of FIG. 1.
Figure 3:
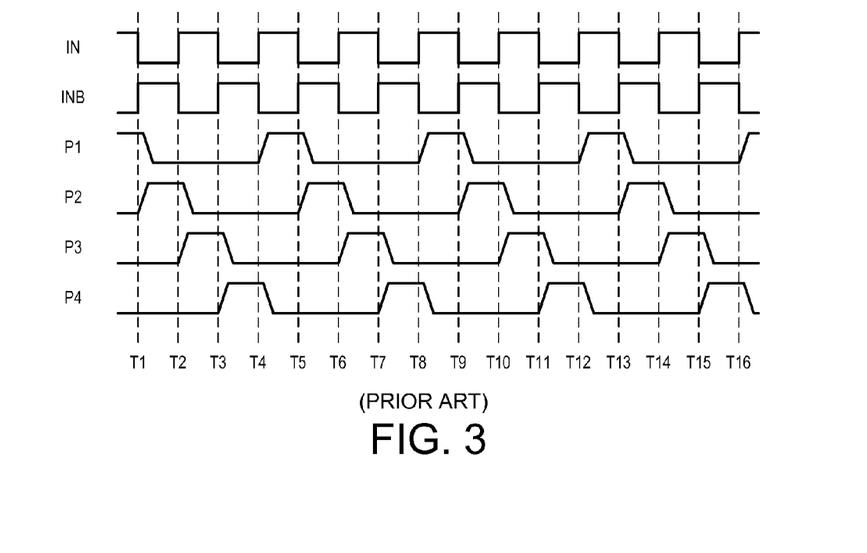
FIG. 3 (Prior Art) is a waveform diagram that illustrates an operation of the Razavi divider of FIG. 1.

FIG. 2 (Prior Art) is a table that sets forth an operation of the Razavi divider of FIG. 1. The first row of the table indicates a starting condition in which the input signals IN and INB are 0 and 1, respectively. The IN and INB signals then transition to the opposite values as indicated in the second row. When INB transitions from the 1 of the first row to the 0 of the second row at time T2, the P-channel transistors 2 and 3 are turned on. Current flow from a VCC conductor through transistor 2 to node 16 causes the voltage of P1 on node 16 to rise and to change from a 0 to a 1. Note that the value of P3 is indicated to change from a 0 to the 1 when transitioning from the first row of the table to the second row of the table. The transitioning of P3 to a 1 causes the voltage on the gate of N-channel transistor 10 to be high, thereby turning on N-channel transistor 10. This in turn causes signal P2 to transition low. At this point, P3 is high, and the other three signals P1, P2 and P4 are low. This condition is reflected in the second row of the table of FIG. 2 and persists until the next change in the input signals IN and INB.

When the input signal IN transitions from a 1 to a 0 as indicated by the second and third rows of the table of FIG. 2 at time T3, P-channel transistors 4 and 5 are turned on. This causes P4 to transition from 0 to 1. The signal P4 is supplied onto the gate of N-channel transistor 9. N-channel transistor 9 is therefore turned on, and signal P3 is made to transition from 1 to 0. At this point, output signal P4 is high, and the other three output signals P1, P2 and P3 are low. This condition is reflected in the third row of the table and persists until the next change in the input signals IN and INB.

When input signal INB transitions from a 1 to a 0 as indicated by the third and fourth rows of the table at time T4, P-channel transistors 2 and 3 are turned on. This causes output signal P1 to transition from 0 to 1. The signal P1 is supplied onto the gate of N-channel transistor 13. N-channel transistor 13 is therefore turned on, and output signal P4 is made to transition from 1 to 0. At this point, output P1 is high, and the other three output signals P2, P3 and P4 are low. This condition is reflected in the fourth row of the table of FIG. 2 and persists until the next change in the input signals IN and INB.

When input signal IN transitions from a 1 to a 0 as indicated by the second and third rows of the table of FIG. 2 at time T5, P-channel transistors 4 and 5 are turned on. This causes P2 to transition from 0 to 1. The signal P2 is supplied onto the gate of N-channel transistor 6. N-channel transistor 6 is therefore turned on, and signal P1 is made to transition from 1 to 0. At this point, output P2 is high, and the other three output signals P1, P3 and P4 are low. This condition is reflected in the fifth row of the table of FIG. 2 and persists until the next change in the input signals IN and INB.

As the differential clock signal (IN and INB) continues to toggle, operation of the divider repeats through the states indicted in the rows of the table of FIG. 2.

SUMMARY

A divide-by-two divider circuit receives a differential sinusoidal input signal and outputs four single-ended output signals, where the frequency of the outputs signals is half the frequency of the differential input signal. The output signals are offset in phase from one another and are: a zero degrees output signal, a ninety degrees output signal, a one hundred eighty degrees output signal, and a two hundred eighty degrees output signal. Each output signal is a rail-to-rail, single-ended signal, that has a first digital logic state for twenty-five percent of the time and that has a second digital logic state for the remaining seventy-five percent of the time. The zero degrees output signal and the one hundred eighty degrees output signal are output by a first latch of the divider.

The ninety degrees output signal and the two hundred seventy degrees output signal are output by a second latch of the divider.

Each output signal is said to have a twenty-five percent duty cycle if the output signal is considered to be an active low signal. Otherwise, if the output signal is considered to be an active high signal, then the output signal has a seventy-five percent duty cycle. The same output signal can therefore be described as having a twenty-five percent duty cycle or a seventy-five percent duty cycle. Regardless of how the perspective from which the output signal is described, the output signal is the same in that it has a first digital logic state for twenty-five percent of the time and has a second digital logic state for the remaining seventy-five percent of the time.

Each latch of the divide-by-two divider circuit includes a cross-coupled pair of P-channel transistors and two output signal generating branches. A static current blocking circuit in each branch prevents current flow through the branch (from the output node of the branch to a ground node) during times when current flow in the branch is not necessary because the signal being output by the branch is not transitioning. The signal input node of the latch is capacitively coupled to an input signal source, and the DC voltage on the signal input node is set by a DC voltage bias circuit. In one example, a Voltage Controlled Oscillator (VCO) of a Phase-Locked Loop (PLL) is the input signal source and supplies the differential sinusoidal input signal to the divider. While consuming less than 0.7 mW (over temperature and process) from a supply voltage VCC of less than 1.0 volt (for example, 0.85 volts), each latch of the divider can output its pair of output signals into loads of at least 15 fF at a frequency of at least 3 GHz so that each output signal has a phase noise of better than 160 dBc/Hz. In one usage in a PLL, the output signals output from the divide-by-two divider circuit vary in frequency from about 0.1 GHz to about 1.5 GHz, depending on the frequency of the differential sinusoidal input signal received from the VCO of the PLL.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

It is recognized that in the prior art circuit of FIG. 1 there are four signal-generating branches. In each branch, current need only flow from the VCC supply voltage node and conductor and through the P-channel transistor of the branch in order to raise the voltage on the output signal node of the branch. For example, in the leftmost branch of the leftmost latch of FIG. 1, the only time the P-channel transistor 2 needs to be on and conducting current from the VCC supply voltage node is when the output signal P1 on node 16 is to transition from 0 to 1 or when the output signal P1 is to be held at the 1 high voltage value. At other times, there is no need for P-channel transistor 2 to be on nor is there any need for current to flow from the VCC supply voltage node onto node 16. When the value of output signal P1 is to be 0, then P-channel transistor 2 need not be on and conductive. Each of the four branches of the Razavi divider of FIG. 1 can be considered in this way.

In accordance with one aspect of the invention, a static current blocking circuit is disposed in each branch of a Razavi-type divider in order to block current flow in the branch to ground GND during times when the current flow is not needed. Each of the latches of the divider receives its input signal through a capacitor and its internal input node is DC biased by a DC voltage bias circuit. In addition, the topology of the Razavi divider circuitry is flipped so that the cross-coupled holding transistors of each latch are P-channel transistors rather N-channel transistors as in the prior art Razavi divider of FIG. 1. As a consequence, each latch can output 1.5 GHz quadrature rail-to-rail output signals into loads of at least 15 fF so that each output signal has a phase noise of better than 160 dBc/Hz, and the latch can do this while consuming less than 0.7 mW from a supply voltage lower than 1.0 volt (for example, 0.85 volts). A pair of two latches together forms a divide-by-two divider that receives a differential sinusoidal input signal (for example, at 3.0 GHz) and that outputs four output signals (for example, at 1.5 GHz): a zero degrees output signal, a ninety degrees output signal, a one hundred eighty degrees output signal, and a two hundred seventy degrees output signal.

Figure 4:
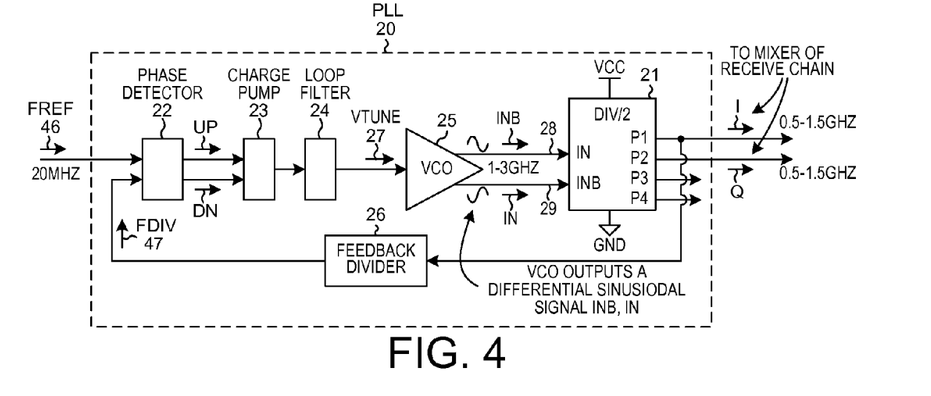
FIG. 4 is a diagram of a Phase-Locked Loop (PLL) within a receiver of a mobile communication device.

FIG. 4 is a diagram of a Phase-Locked Loop (PLL) 20 within a RF receiver of a mobile communication device such as, for example, a cellular telephone. PLL 20 employs the novel divide-by-two divider circuit 21. PLL 20 includes a phase detector 22, a charge pump 23, a loop filter 24, a low-noise VCO 25, the novel divide-by-two divider circuit 21, and a loop divider 26. VCO 25 is an LC-type oscillator that receives a tuning voltage signal VTUNE 27 and that outputs a low phase noise differential sinusoidal VCO output signal. A VCO that outputs sinusoidal signals like this generally uses inductors and LC circuits. Due to the inherent filtering provided by these components, such VCOs have superior phase noise performance compared to rail-to-rail oscillators (like ring oscillators). The differential sinusoidal VCO output signal output by VCO 25 is tunable in frequency range of 1-3 GHz. The differential sinusoidal VCO output signal involves a signal INB on signal conductor 28 and involves a signal IN on conductor 29. The phase detector 22 receives a 20 MHz reference clock signal FREF 46 from a crystal oscillator and compares this stable reference clock signal FREF with a feedback signal FDIV 47. Feedback signal FDIV 47 is output by loop divider 26.

The divide-by-two divider circuit 21 generates and outputs four single-ended output signals P1, P2, P3 and P4. Each of the four output signals has a first digital logic value for twenty-five percent of the time and has a second digital logic value for the remaining seventy-five percent of the time. P2 is ninety degrees out of phase with respect to P1, and P3 is ninety degrees out of phase with respect to P2, and P4 is ninety degrees out of phase with respect to P3, and P1 is ninety degrees out of phase with respect to P4. P1 and P2 are also referred to as I and Q quadrature signals. These quadrature signals I and Q are supplied by the divide-by-two divider circuit 21 to a mixer in the receive chain of the RF receiver. The I and Q signals may be supplied directly to the mixer or the I and Q signals may be supplied indirectly to the mixer through intervening buffer or inverter circuitry. In one example, the mixer is a passive mixer. Many times, and in this example, is it advantageous to use low-duty-cycle clock signals to drive such the passive mixer because the mixer switch overlap is removed.

Figure 5:
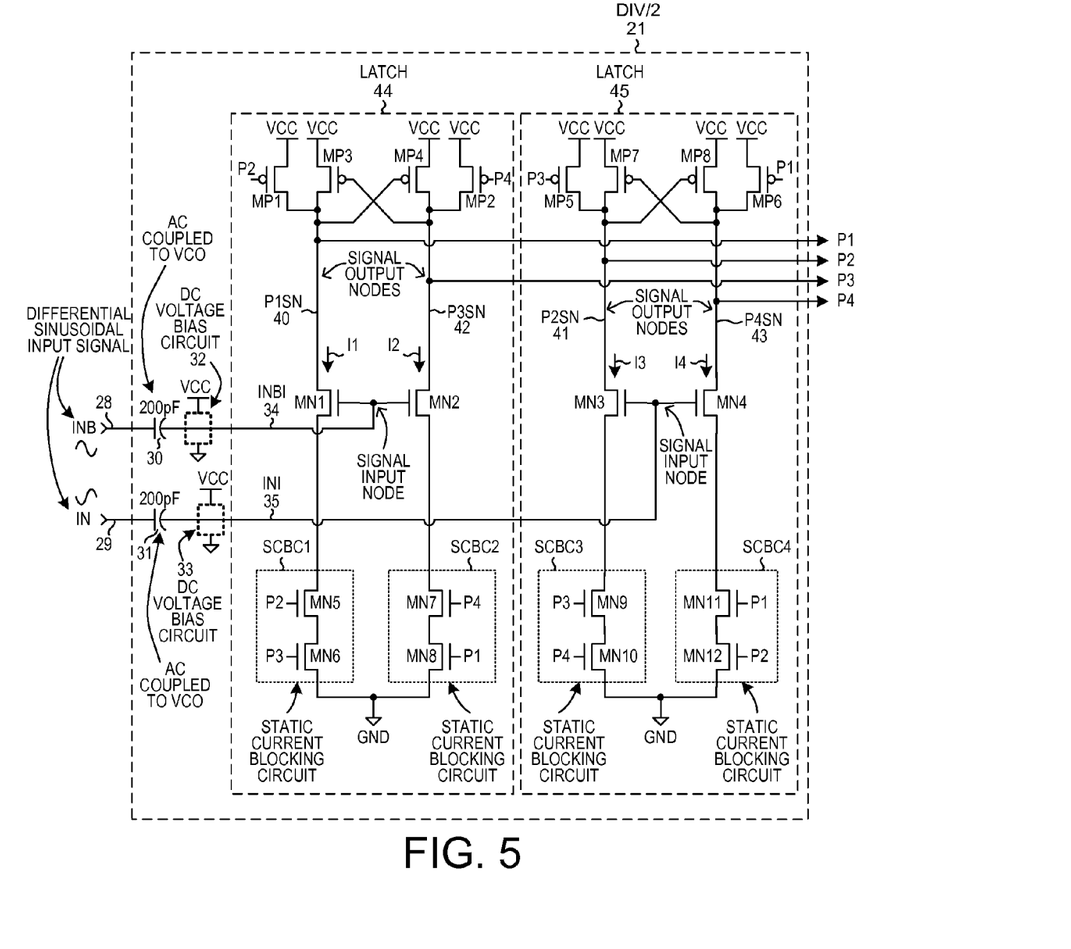
FIG. 5 is a diagram of a divide-by-two divider circuit in the PLL of FIG. 4.

FIG. 5 is a circuit diagram of the divide-by-two divider circuit 21 of the PLL 20 of FIG. 4. The bar symbol labeled VCC in FIG. 5 identifies a supply voltage node and conductor. The triangle symbol labeled GND denotes a ground potential node and conductor. Each of the four branches of divider circuit 21 has a static current blocking circuit as shown. Divide-by-two divider circuit 21 is AC coupled to the VCO output conductors 28 and 29 via capacitors 30 and 31, respectively. A DC voltage bias circuit 32 sets the DC bias voltage on internal input signal INBI node 34. A DC voltage bias circuit 33 sets the DC bias voltage on internal input signal INI node 35. The two DC voltage bias circuits 32 and 33 are of identical construction.

Figure 6:
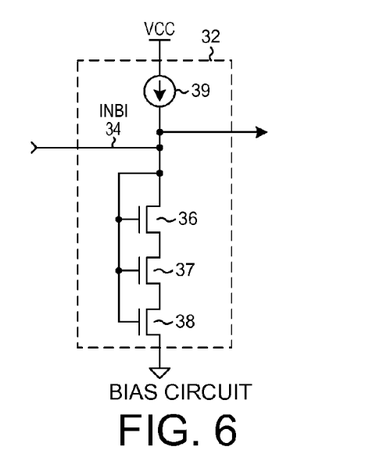
FIG. 6 is a diagram of a DC voltage bias circuit in the divide-by-two divider circuit of FIG. 5.

FIG. 6 is a more detailed diagram of DC voltage bias circuit 32 of FIG. 5. N-channel transistors 36-38 mimic DC response operation of the stack of N-channel transistors of a branch, and the current source 39 mimics DC response operation of the P-channel current-supplying portion of the branch. The current source and the N-channel transistors of the stack, however, are scaled smaller versions of the actual branch of the divider so that current flow from the VCC supply voltage node through the bias circuit of FIG. 6 and to ground node GND will be small and is just adequate to set the DC bias voltage point of the voltage on internal input signal INBI node 34.

Figure 7:
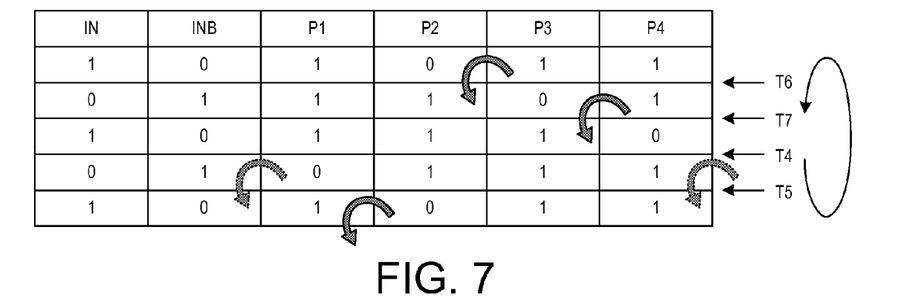
FIG. 7 is a table that sets for an operation of the divide-by-two divider of FIG. 5.

FIG. 7 is a table that sets forth operation of divide-by-two divider circuit 21.

Figure 8:
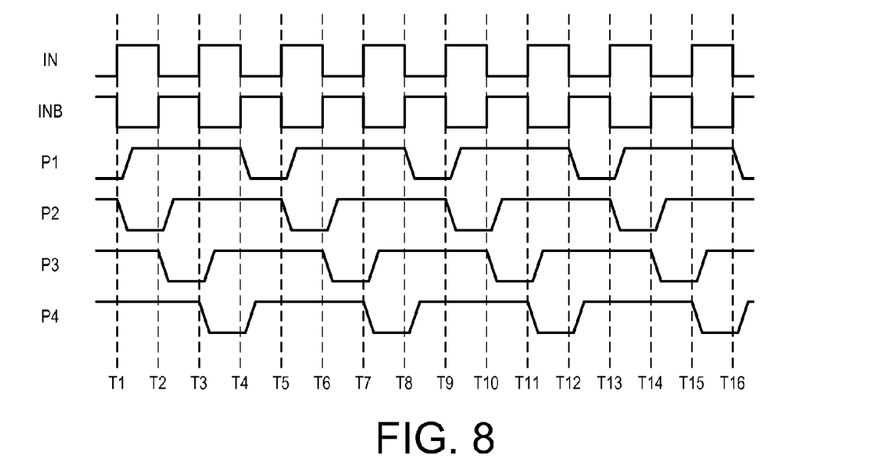
FIG. 8 is a simplified waveform diagram that illustrates an operation of the divide-by-two divider of FIG. 5.

FIG. 8 is a waveform diagram that sets forth operation of divide-by-two divider circuit 21. Although the signals (IN and INB) that make up the differential input signal are illustrated in the simplified waveform diagram of FIG. 8 as having rectangular waveshapes, it is understood that each of the signals IN and INB of the differential input signal actually has a sinusoidal waveshape as explained above.

Figure 9:
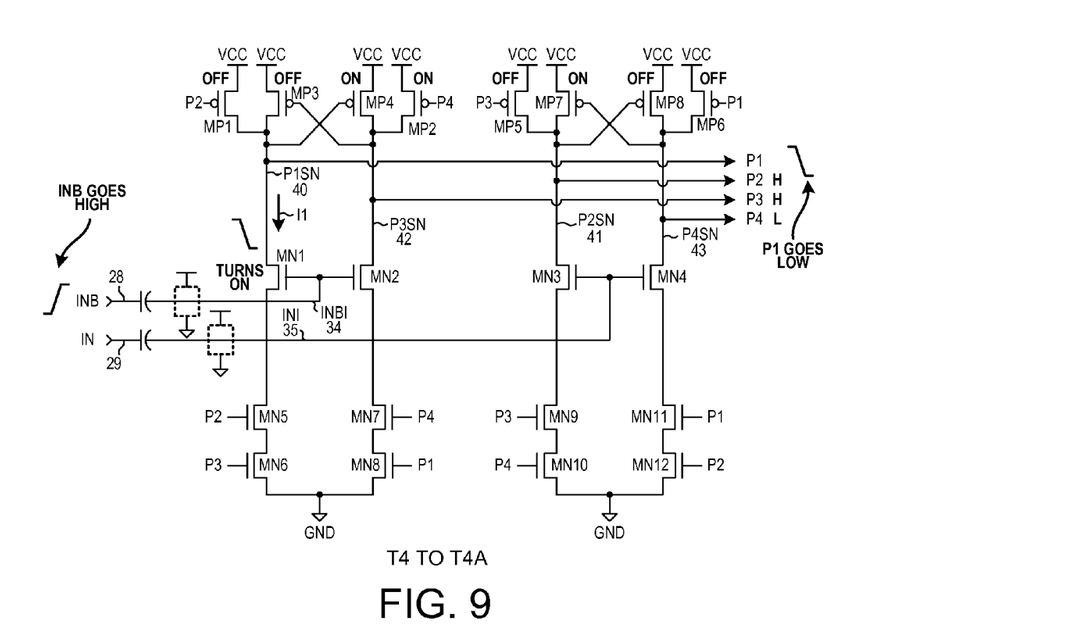
FIG. 9 is a circuit diagram that illustrates operation of the divide-by-two divider circuit of FIG. 5 during a time when output signal P1 transitions from high to low.
Figure 10:
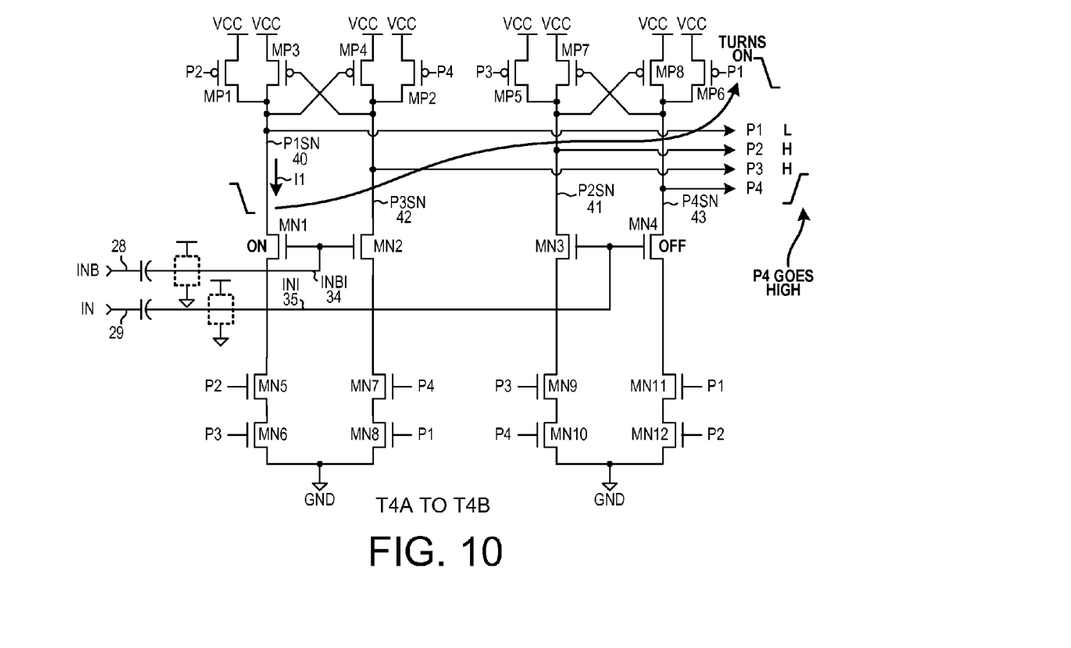
FIG. 10 is a circuit diagram that illustrates operation of the divide-by-two divider circuit of FIG. 5 during a time when output signal P4 transitions from low to high.

FIG. 9 is a circuit diagram that illustrates operation of divider circuit 21. In response to input signal INB transitioning from 0 and 1, transistor MN1 is turned on. The turning on of transistor MN1 causes the output signal P1 on P1SN node 40 to transition from 1 to 0. As shown in FIG. 10, the transitioning of signal P1 from 1 to 0 at time T4 causes P-channel transistor MP6 to turn on, and causes signal P4 on P4SN node 43 to transition from 0 to 1. This condition is indicated in the fourth row of the table of FIG. 7 and persists until the next change in the input signals IN and INB. Input signal INB is one hundred eighty degrees out of phase with respect to input signal IN.

Figure 11:
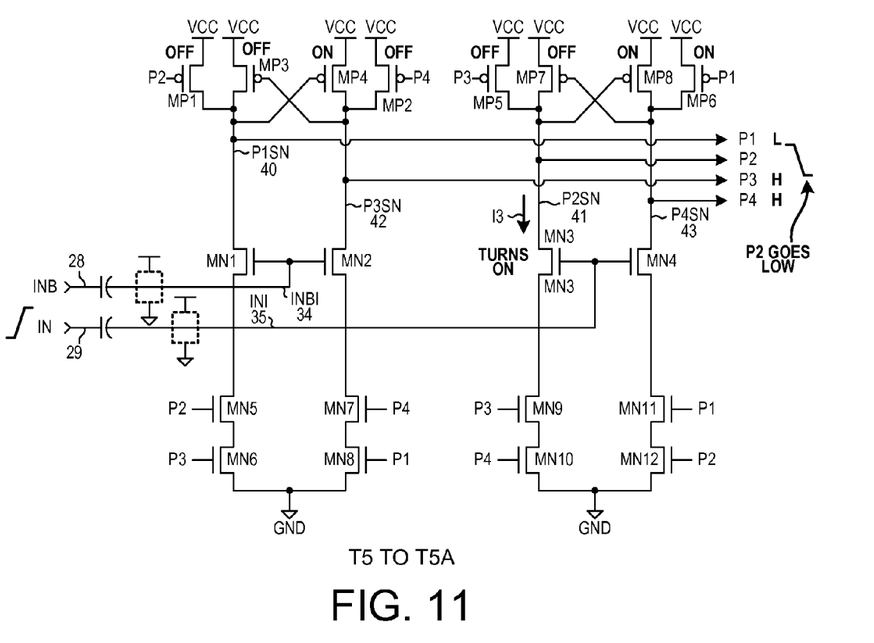
FIG. 11 is a circuit diagram that illustrates operation of the divide-by-two divider circuit of FIG. 5 during a time when output signal P2 transitions from high to low.
Figure 12:
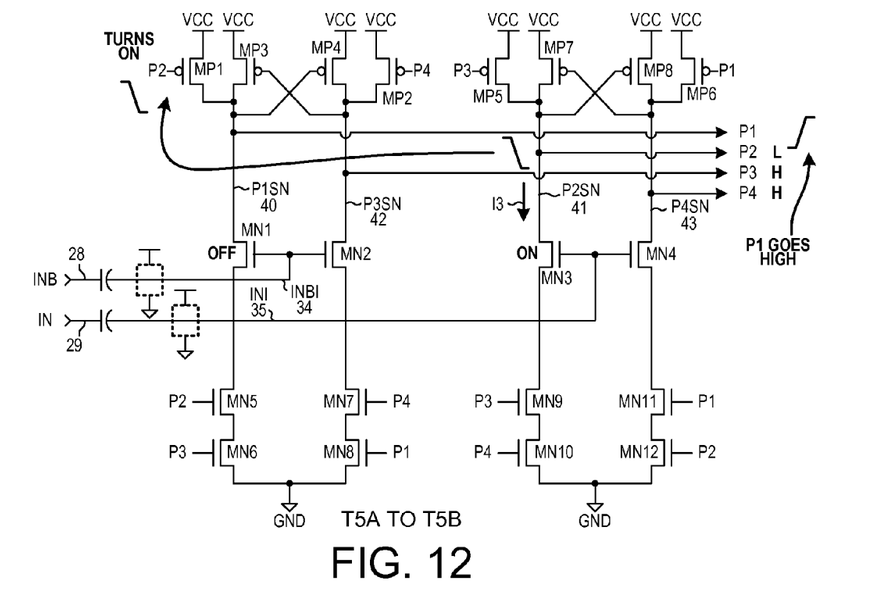
FIG. 12 is a circuit diagram that illustrates operation of the divide-by-two divider circuit of FIG. 5 during a time when output signal P2 transitions from low to high.

Next (see FIG. 11), in response to input signal IN transitioning from 0 and 1, transistor MN3 is turned on, and this causes the signal P2 to transition from 1 to 0. As shown in FIG. 12, the transitioning of signal P2 from 1 to 0 at time T5 causes P-channel transistor MP1 to turn on, and causes signal P1 on node P1SN 40 to transition from 0 to 1. This condition is indicated in the fifth row of the table of FIG. 7 and persists until the next change in the input signals IN and INB. The fifth row of the table of FIG. 7 represents the same condition as the first row of the table.

Figure 13:
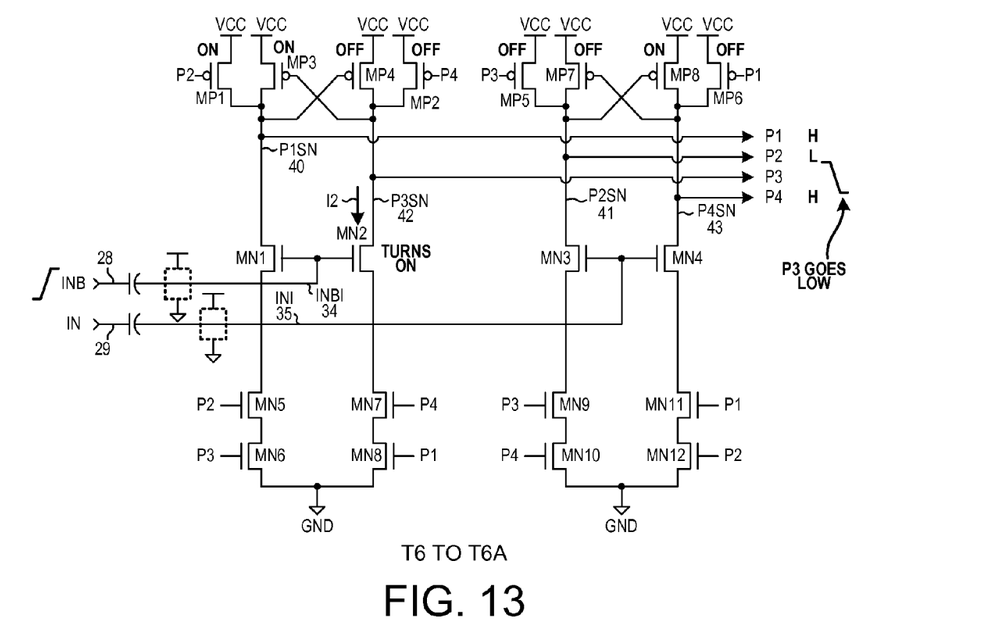
FIG. 13 is a circuit diagram that illustrates operation of the divide-by-two divider circuit of FIG. 5 during a time when output signal P3 transitions from high to low.
Figure 14:
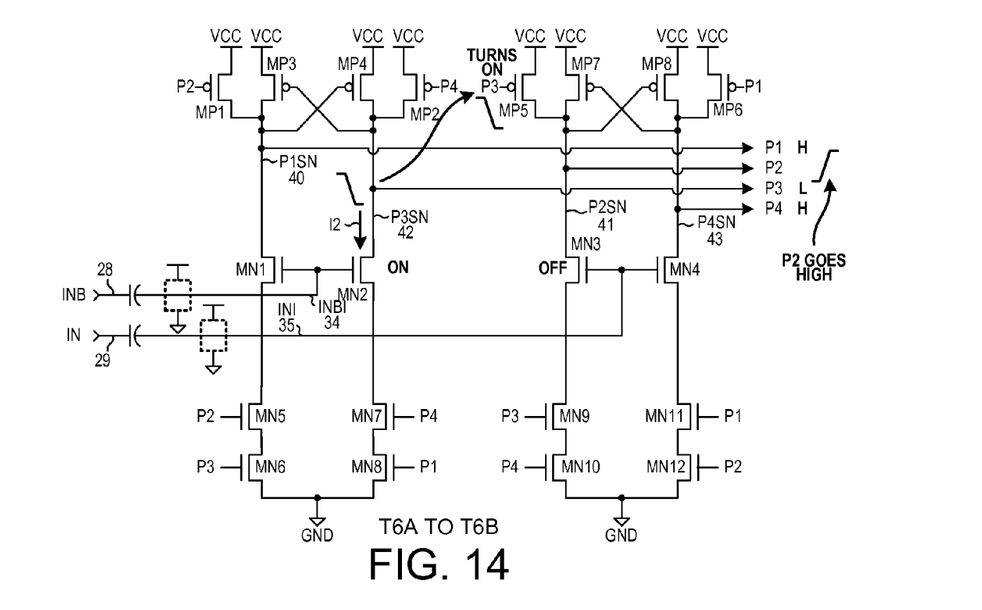
FIG. 14 is a circuit diagram that illustrates operation of the divide-by-two divider circuit of FIG. 5 during a time when output signal P2 transitions from low to high.

Next (see FIG. 13), in response to input signal INB transitioning from 0 and 1, transistor MN2 is turned on, and this causes the signal P3 on node P3SN to transition from 1 to 0. As shown in FIG. 14, the transitioning of signal P3 from 1 to 0 at time T6 causes P-channel transistor MP5 to turn on, and causes signal P2 to transition from 0 to 1. This condition is indicated in the second row of the table of FIG. 7 and persists until the next change in the input signals IN and INB.

Figure 15:
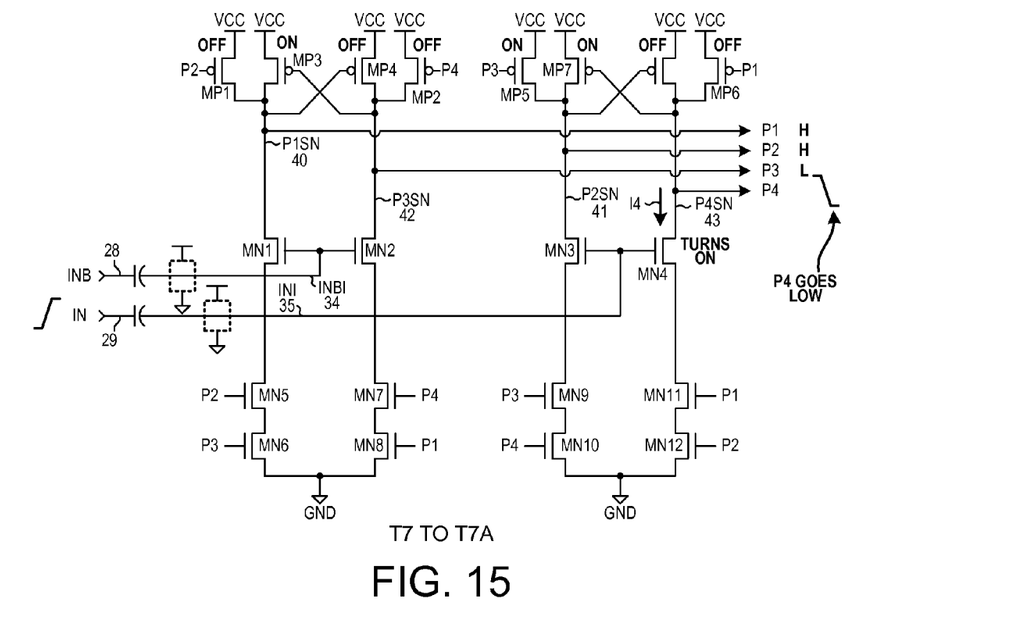
FIG. 15 is a circuit diagram that illustrates operation of the divide-by-two divider circuit of FIG. 5 during a time when output signal P4 transitions from high to low.
Figure 16:
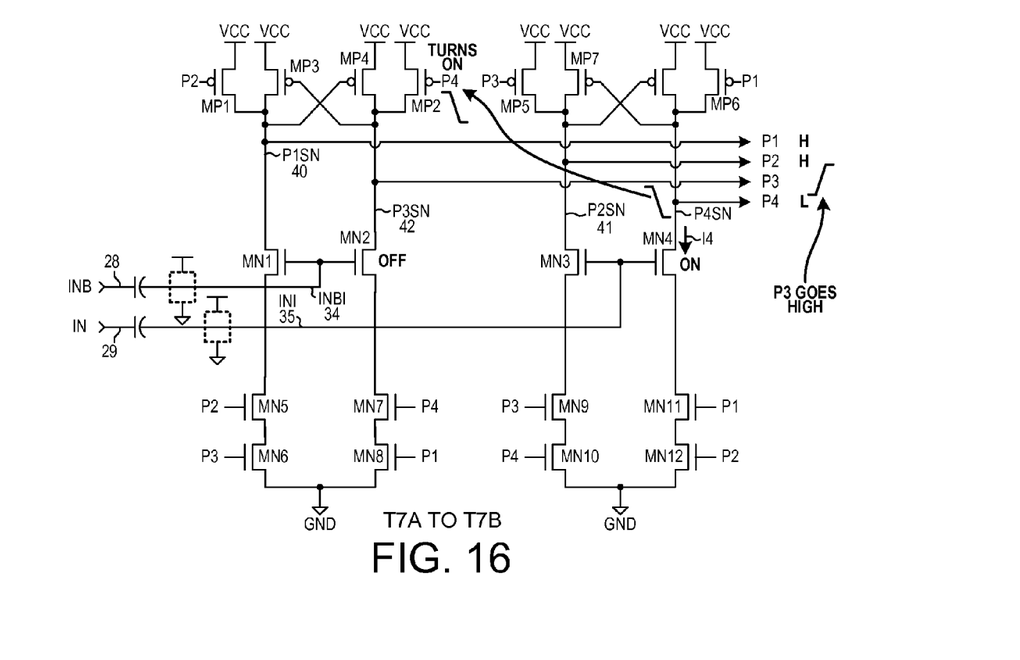
FIG. 16 is a circuit diagram that illustrates operation of the divide-by-two divider circuit of FIG. 5 during a time when output signal P3 transitions from low to high.

Next (see FIG. 15), in response to input signal IN transitioning from 0 and 1, transistor MN4 is turned on, and this causes the signal P4 to transition from 1 to 0. As shown in FIG. 16, the transitioning of signal P4 from 1 to 0 at time T7 causes P-channel transistor MP2 to turn on, and causes signal P3 to transition from 0 to 1. This condition is indicated in the third row of the table of FIG. 7 and persists until the next change in the input signals IN and INB.

As the differential sinusoidal input signal (IN and INB) continues to toggle (oscillate) back and forth, operation of divider circuit 21 repeats through the states set forth in the table of FIG. 7 and in the transitions illustrated in connection with FIGS. 9-16.

Figure 17:
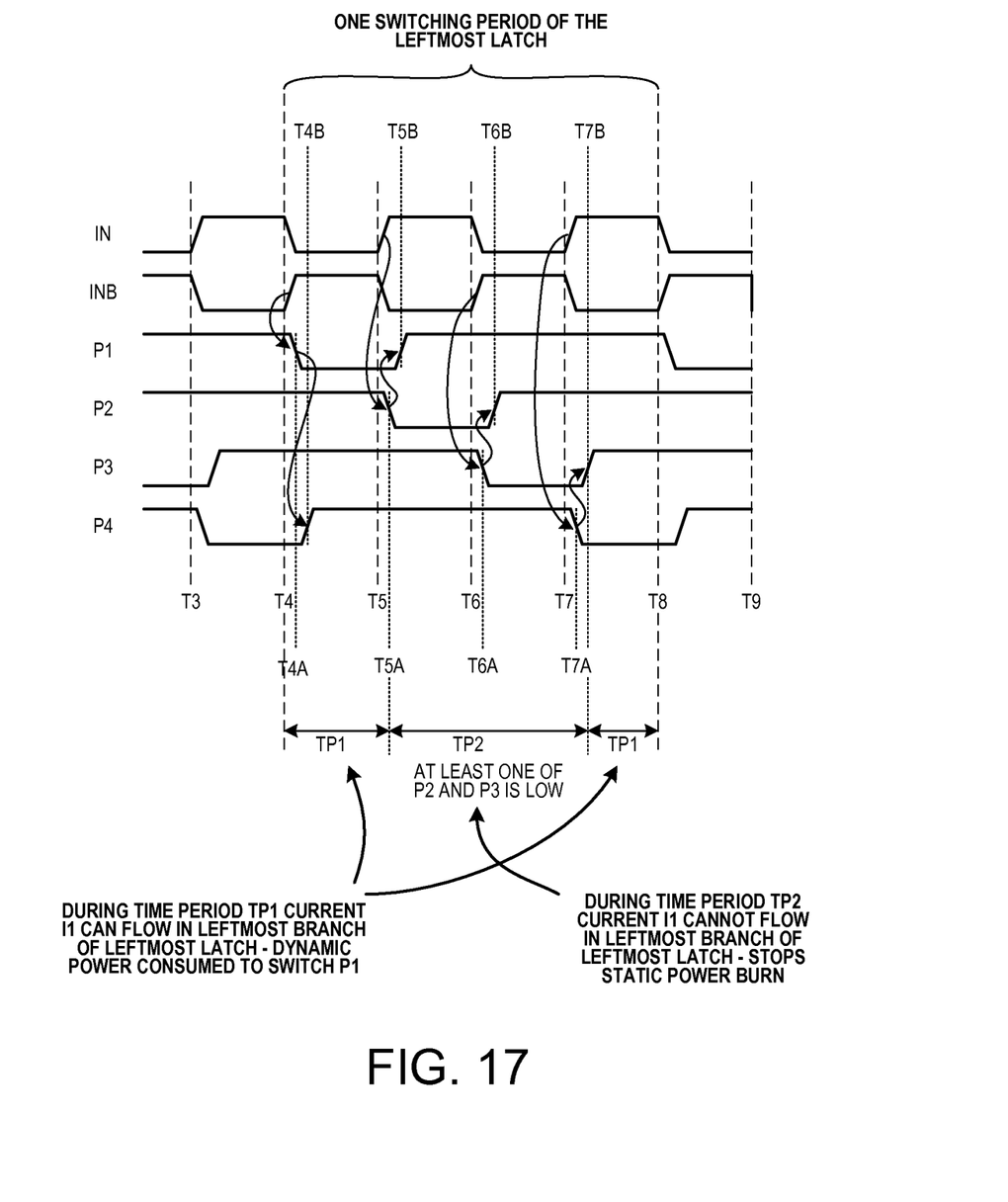
FIG. 17 is an expanded diagram of a portion of the simplified waveform diagram of FIG. 8 showing how the static current blocking circuit of a branch blocks static current flow through the branch during certain periods of the output signal that is output by the branch.

FIG. 17 is an expanded view of a portion of the simplified waveform diagram of FIG. 8. Consider, for example, operation of the leftmost branch of the leftmost latch 44 of the divide-by-two divider circuit 21. This branch is responsible for generating and outputting the output signal P1. The output signal P1 is only pulled low to ground potential about twenty-five percent of the time. To cause the voltage of output signal P1 to be pulled low in response to the rising edge of INB at time T4, a current is to flow in the leftmost branch of the leftmost latch through N-channel transistor MN1 and to ground GND, but between time T5B and time T8 the value of output signal P1 is 1 and there is no need for current flow to ground in the leftmost branch of the leftmost latch. The static current blocking circuit SCBC1 of the leftmost branch of leftmost latch 44 works by blocking current flow to ground node GND in the branch unless both P2 and P3 are 1. This time period TP1 during which current may flow is indicated in FIG. 17. During the remainder of the period of signal P1, either output signal P2 is 0 or output signal P3 is 0. The static current blocking circuit SCBC1 therefore blocks current flow to ground during this time period TP2. As mentioned above, current flow to ground GND is not needed during time period TP2 when the output signal P1 is not to be pulled down to ground potential. The "static" component of the overall current consumption of the leftmost branch of leftmost latch 44 is therefore reduced.

As indicated in FIG. 5, each of the four branches of the divide-by-two circuit 21 has a similar static current blocking circuit. The static current blocking circuit SCBC2 of the rightmost branch of the leftmost latch works by blocking current flow to ground unless both P4 and P1 are 1. The static current blocking circuit SCBC3 of the leftmost branch of the rightmost latch 45 works by blocking current flow to ground unless both P3 and P4 are 1. The static current blocking circuit SCBC4 of the rightmost branch of rightmost latch 45 works by blocking current flow to ground unless both P1 and P2 are 1. By reducing static current consumption in the four branches of the divide-by-two circuit 21, overall power consumption of the divider is reduced as compared to the prior art Razavi divider of FIG. 1.

Figure 18:
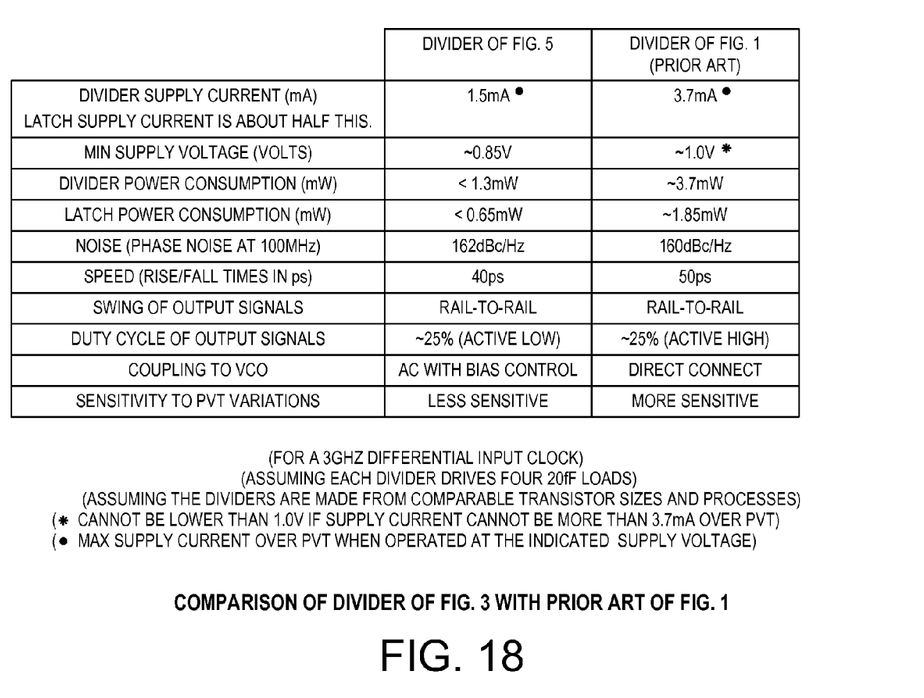
FIG. 18 is a table that sets forth a comparison of the divide-by-two divider circuit of FIG. 5 to the prior art Razavi divider of FIG. 1.

FIG. 18 is a table that sets forth a comparison of the divide-by-two circuit 21 of FIG. 5 to the prior art divider of FIG. 1, assuming both dividers are receiving 3 GHz input clock signals, assuming that both dividers are driving four identical 20 fF loads, and assuming that both circuits are realized in comparable semiconductor processes using comparable sized transistors. Not only does the divide-by-two circuit 21 of FIG. 5 consume substantially less supply current than the prior art divider of FIG. 1, but also the divide-by-two circuit 21 of FIG. 5 also outputs signals P1-P4 having less phase noise and also outputs signals P1-P4 having shorter rise/fall times. Each of the two latches of the divide-by-two circuit 21 of FIG. 5, when operating from a low 0.85 volt supply voltage VCC and when driving capacitive loads at least 15 fF (for example, each load is 20 fF), consumes less than 0.7 mW and outputs two quadrature, rail-to-rail, 0.85 volts voltage swing, twenty-five percent duty cycle signals having a phase noise of better than 160 dBc/Hz. Together, the two latches 44 and 45 output: a zero degrees output signal 0D (signal P1 in FIG. 5), a ninety degrees output signal 90D (signal P2 in FIG. 5), a one hundred eighty degrees output signal 180D (signal P3 in FIG. 5), and a two hundred seventy degrees output signal 270D (signal P4 in FIG. 5). In comparison, the prior art divider of FIG. 1 is more sensitive to variations in performance over PVT (process, voltage, and temperature). If the maximum divider supply current of the prior art divider of FIG. 1 is not to exceed 3.7 mA over PVT, then the minimum supply voltage at which the prior art divider of FIG. 1 can operate while remaining within performance specifications is about 1.0 volts. The divide-by-two circuit 21 of FIG. 5, on the other hand, can operate within the same performance specifications but with a lower supply voltage of 0.85 volts without the divider supply current exceeding 1.5 mA over PVT. This improvement in the variability of divider supply current over PVT is due to better control of static current consumption in the branches of the latches as described above.

An output signal of divide-by-two divider circuit 21 is said to have a twenty-five percent duty cycle because the output signal is considered to be an active low signal. Otherwise, if the output signal is considered to be an active high signal, then the output signal has a seventy-five percent duty cycle. Regardless of how the output signal is described, the signal is the same in that it has one digital logic state for twenty-five percent of the time and has the other digital logic state for seventy-five percent of the time.

There are multiple ways of realizing the static current blocking circuits SCBC1-SCBC4. In one embodiment, N-channel transistors MN5, MN7, MN9 and MN11 are not provided such that MN6, MN8, MN10 and MN12 form the static current blocking circuits. In another embodiment, N-channel transistors MN6, MN8, MN10 and MN12 are not provided such that MN5, MN7, MN9 and MN11 form the static current block circuits. In another embodiment, a single current blocking transistor is provided, but it is controlled to be off during certain selected periods by a logic gate. For example, a logic gate may output a digital logic signal onto the gate of the single current blocking transistor so that the logic gate and the single current blocking transistor together form the static current blocking circuit SCBC1 of FIG. 5. If either output signal P2 is low or if output signal P3 is low, then the logic gate outputs a digital signal onto the gate of the single current blocking transistor to turn off the transistor and to block static current I1 from flowing from output node P1SN 40 and to ground node GND, otherwise the logic gate outputs the digital signal onto the gate of the single current blocking transistor such that the transistor is on. The other static current blocking circuits SCBC2, SCBC3 and SCBC4 are realized in a commensurate fashion. Different types of circuitry, including different types of logic and/or transistors, can be used to realize the functions of the static current blocking circuits SCBC1-SCBC4. Depending on the application of the divider, static current flow may be blocked in a branch for more or less of the time of the overall period of the output signal being output by the branch.

Figure 19:
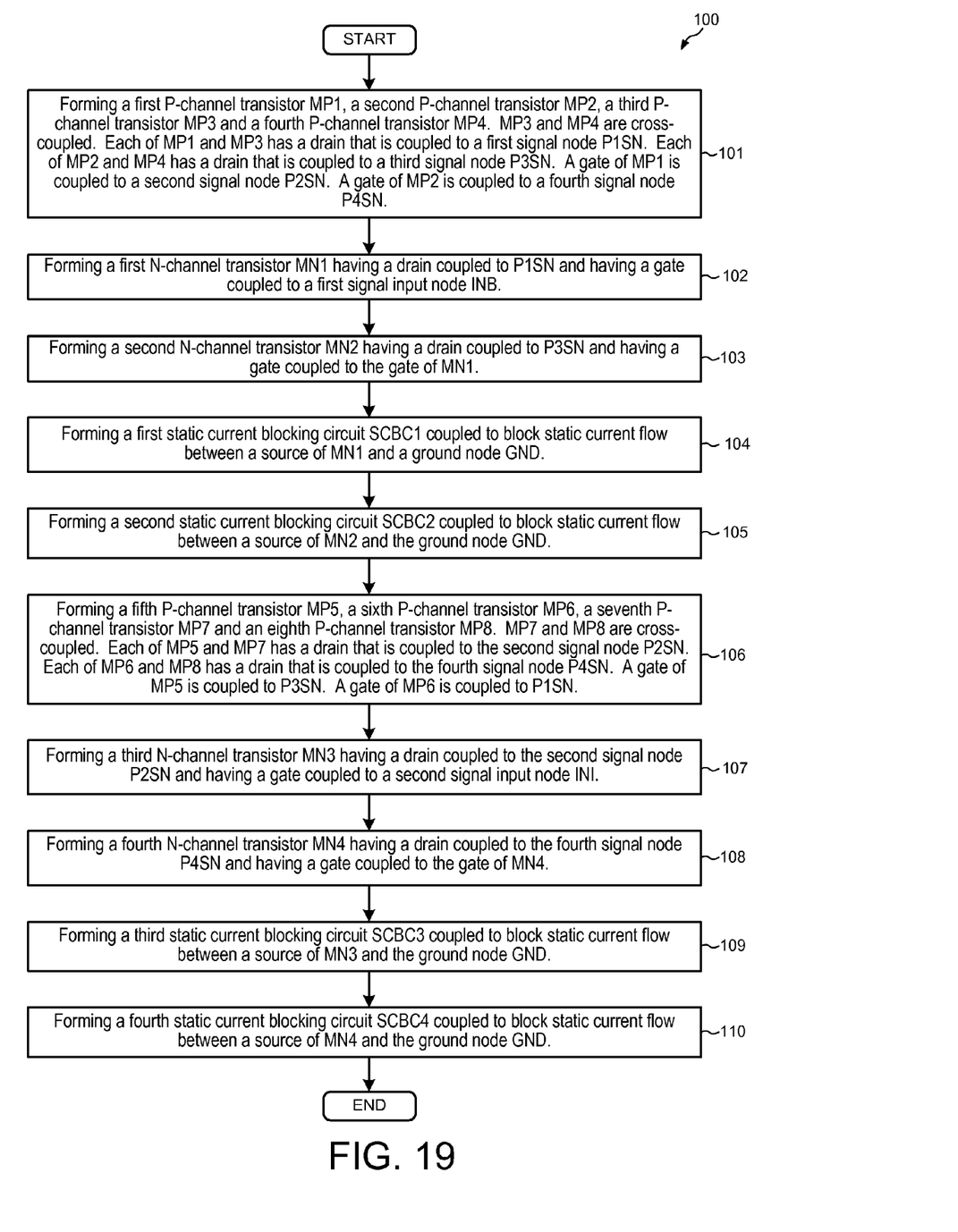
FIG. 19 is a flowchart of a method of manufacturing the divide-by-two divider circuit of FIG. 5.

FIG. 19 is a flowchart of a method 100 of manufacturing the divide-by-two divider circuit 21 of FIG. 5 in accordance with one novel aspect. In one example, the divide-by-two divider circuit 21 is manufactured in a 28 nm CMOS process. Transistors MP1, MP2, MP5 and MP6 have W/L geometries of 19.2 um/30 nm. Transistors MP3, MP4, MP7 and MP8 have W/L geometries of 9.6 um/30 nm. Transistors MN1-MN4 have W/L geometries of 24 um/30 nm. Transistors MN5-MN12 have W/L geometries of 28.8 um/30 nm. Capacitors 30 and 31 are MIM (metal-insulator-metal) capacitors having a capacitance of 200 fF. When CMOS digital logic circuitry is realized using this process, the digital logic circuitry is operable with the VCC supply voltage down to 0.85 volts and the divide-by-two divider circuit 21 operates as set forth in FIG. 18.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A divide-by-two divider circuit, comprising:
   a first latch comprising:
      a first P-channel transistor (MP1) having a source, a gate and a drain, wherein the drain of the MP1 is coupled to a P1 signal node (P1SN), and wherein the gate of the MP1 is coupled to a P2 signal node (P2SN);

a second P-channel transistor (MP2) having a source, a gate and a drain, wherein the drain of the MP2 is coupled to a P3 signal node (P3SN), and wherein the gate of the MP2 is coupled to a P4 signal node (P4SN);

a third P-channel transistor (MP3) having a source, a gate and a drain, wherein the drain of the MP3 is coupled to the P1SN, and wherein the gate of the MP3 is coupled to the P3SN;

a fourth P-channel transistor (MP4) having a source, a gate and a drain, wherein the drain of the MP4 is coupled to the P3SN and to the gate of the MP3, and wherein the gate of the MP4 is coupled to the P1SN;

a first N-channel transistor (MN1) having a source, a gate and a drain, wherein the drain of the MN1 is coupled to the P1SN, and wherein the gate of the MN1 is coupled to a first signal input node (INBI);

a second N-channel transistor (MN2) having a source, a gate and a drain, wherein the drain of the MN2 is coupled to the P3SN, and wherein the gate of the MN2 is coupled to the gate of the MN1;

a first static current blocking circuit (SCBC1) coupled to block static current flow between the source of the MN1 and a ground node (GND); and a second static current blocking circuit (SCBC2) coupled to block static current flow between the source of the MN2 and the GND; and a second latch comprising:

a first P-channel transistor (MP5) having a source, a gate and a drain, wherein the drain of the MP5 is coupled to the P2SN, and wherein the gate of the MP5 is coupled to the P3SN;

a second P-channel transistor (MP6) having a source, a gate and a drain, wherein the drain of the MP6 is coupled to the P4SN, and wherein the gate of the MP6 is coupled to the P1SN;

a third P-channel transistor (MP7) having a source, a gate and a drain, wherein the drain of the MP7 is coupled to the P2SN, and wherein the gate of the MP7 is coupled to the P4SN;

a fourth P-channel transistor (MP8) having a source, a gate and a drain, wherein the drain of the MP8 is coupled to the P4SN and to the gate of the MP7, and wherein the gate of the MP8 is coupled to the P2SN;

a first N-channel transistor (MN3) having a source, a gate and a drain, wherein the drain of the MN3 is coupled to the P2SN, and wherein the gate of the MN3 is coupled to a second signal input node INI;

a second N-channel transistor (MN4) having a source, a gate and a drain, wherein the drain of the MN4 is coupled to the P4SN, and wherein the gate of the MN4 is coupled to the gate of the MN3;

a third static current blocking circuit (SCBC3) coupled to block static current flow between the source of the MN3 and the GND; and a fourth static current blocking circuit (SCBC4) coupled to block static current flow between the source of the MN4 and the GND.

2. The divide-by-two divider circuit of claim 1, wherein the SCBC1 comprises an N-channel transistor (MN5), and wherein a gate of the MN5 is coupled to the P2SN;

wherein the SCBC2 comprises an N-channel transistor (MN7), and wherein a gate of the MN7 is coupled to the P4SN;

wherein the SCBC3 comprises an N-channel transistor (MN9), and wherein a gate of the MN9 is coupled to the P3SN; and wherein the SCBC4 comprises an N-channel transistor (MN11), and wherein a gate of the MN11 is coupled to the P1SN.

3. The divide-by-two divider circuit of claim 2, wherein a drain of the MN5 is coupled to the source of the MN1, wherein a drain of the MN7 is coupled to the source of the MN2, wherein a drain of the MN9 is coupled to the source of the MN3, and wherein a drain of the MN11 is coupled to the source of the MN4.

4. The divide-by-two divider circuit of claim 1, wherein the SCBC1 comprises an N-channel transistor (MN6), and wherein a gate of the MN6 is coupled to the P3SN;

wherein the SCBC2 comprises an N-channel transistor (MN8), and wherein a gate of the MN8 is coupled to the P1SN;

wherein the SCBC3 comprises an N-channel transistor (MN10), and wherein a gate of the MN10 is coupled to the P4SN; and wherein the SCBC4 comprises an N-channel transistor (MN12), and wherein a gate of the MN12 is coupled to the P2SN.

5. The divide-by-two divider circuit of claim 4, wherein a source of the MN6 is coupled to the GND, wherein a source of the MN8 is coupled to the GND, wherein a source of the MN10 is coupled to the GND, and wherein a source of the MN12 is coupled to the GND.

6. The divide-by-two divider circuit of claim 1, wherein the SCBC1 comprises two series-connected N-channel transistors MN5 and MN6, wherein the SCBC2 comprises two series-connected N-channel transistors MN7 and MN8, wherein the SCBC3 comprises two series-connected N-channel transistors MN9 and MN10, and wherein the SCBC4 comprises two series-connected N-channel transistors MN11 and MN12.

7. The divide-by-two divider circuit of claim 1, further comprising:

a first capacitor having a first plate coupled to the INBI and having a second plate coupled to first output lead of a Voltage Controlled Oscillator (VCO); and a second capacitor having a first plate coupled to the INI and having a second plate coupled to a second output lead of the VCO.

8. The divide-by-two divider circuit of claim 1, further comprising:

a first bias circuit that supplies a first bias voltage onto the INBI; and a second bias circuit that supplies a second bias voltage onto the INI.

9. A method of manufacturing a divide-by-two divider circuit, the method comprising:

forming a first P-channel transistor (MP1), a second P-channel transistor (MP2), a third P-channel transistor (MP3) and a fourth P-channel transistor (MP4), wherein the MP3 and the (MP4) are cross-coupled, wherein each of the MP1 and the MP3 has a drain that is coupled to a first signal node (P1SN), wherein each of the MP2 and the MP4 has a drain that is coupled to a third signal node (P3SN), wherein a gate of the MP1 is coupled to a second signal node (P2SN), and wherein a gate of the MP2 is coupled to a fourth signal node (P4SN);

forming a first N-channel transistor (MN1) having a drain coupled to the P1SN and having a gate coupled to a first signal input node (INBI);

forming a second N-channel transistor (MN2) having a drain coupled to the P3SN and having a gate coupled to the gate of the MN1;

forming a first static current blocking circuit (SCBC1) coupled to block static current flow between a source of the MN1 and a ground node (GND);

forming a second static current blocking circuit (SCBC2) coupled to block static current flow between a source of the MN2 and the GND;

forming a fifth P-channel transistor (MP5), a sixth P-channel transistor (MP6), a seventh P-channel transistor (MP7) and an eighth P-channel transistor (MP8), wherein the MP7 and the MP8 are cross-coupled, wherein each of the MP5 and the MP7 has a drain that is coupled to a second signal node, wherein each of the MP6 and the MP8 has a drain that is coupled to a fourth signal node, wherein a gate of the MP5 is coupled to the P3SN, and wherein a gate of the MP6 is coupled to the P1SN;

forming a third N-channel transistor (MN3) having a drain coupled to the second signal node and having a gate coupled to a second signal input node (INI);

forming a fourth N-channel transistor (MN4) having a drain coupled to the fourth signal node and having a gate coupled to the gate of the MN3;

forming a third static current blocking circuit (SCBC3) coupled to block static current flow between a source of the MN3 and the GND; and forming a fourth static current blocking circuit (SCBC4) coupled to block static current flow between a source of the MN4 and the GND.

10. The method of manufacturing of claim 9, wherein the forming of the SCBC1 involves:

forming a transistor (MN5) having a gate that is coupled to the P2SN.

11. The method of claim 10, wherein a drain of the MN5 is coupled to the source of the MN1.

12. The method of manufacturing of claim 9, wherein the forming of the SCBC1 involves:

forming a transistor (MN6) having a gate that is coupled to the P3SN.

13. The method of manufacturing of claim 12, wherein a source of the MN6 is coupled to the GND.

14. The method of manufacturing of claim 9, wherein the forming of the SCBC1 involves:

forming a transistor (MN5) having a gate that is coupled to the P2SN, and forming a transistor (MN6) having a gate that is coupled to the P3SN, wherein the MN5 and the MN6 are coupled so that a drain of one of the MN5 and the MN6 is coupled to a source of the other of the MN5 and the MN6.

15. The method of manufacturing of claim 9, further comprising:

forming a first capacitor having a first plate coupled to the INBI and having a second plate coupled to first output lead of a Voltage Controlled Oscillator (VCO); and forming a second capacitor having a first plate coupled to the INI and having a second plate coupled to a second output lead of the VCO.

16. The method of manufacturing of claim 9, further comprising:

forming a first bias circuit adapted to supply a first bias voltage onto the INBI; and forming a second bias circuit adapted to supply a second bias voltage onto the INI.

17. The method of manufacturing of claim 9, wherein the method is a method of manufacturing the divide-by-two divider circuit in integrated circuit form.

18. A divide-by-two divider circuit, comprising:

a first latch comprising:

a first transistor (M1) having a source, a gate and a drain, wherein the drain of the M1 is coupled to a first output signal node, and wherein the gate of the M1 is coupled to a second output signal node;

a second transistor (M2) having a source, a gate and a drain, wherein the drain of the M2 is coupled to a third output signal node, and wherein the gate of the M2 is coupled to a fourth output signal node;

a third transistor (M3) having a source, a gate and a drain, wherein the drain of the M3 is coupled to the first output signal node, and wherein the gate of the M3 is coupled to the third output signal node;

a fourth transistor (M4) having a source, a gate and a drain, wherein the drain of the M4 is coupled to the third output signal node and to the gate of the M3, and wherein the gate of the M4 is coupled to the first output signal node;

a fifth transistor (M5) having a source, a gate and a drain, wherein the drain of the M5 is coupled to the first output signal node, and wherein the gate of the M5 is coupled to a first input signal node;

a sixth transistor (M6) having a source, a gate and a drain, wherein the drain of the M6 is coupled to the third output signal node, and wherein the gate of the M6 is coupled to the gate of the M5;

a first means for blocking a static current flow between the source of the M5 and a common node; and a second means for blocking static current flow between the source of the M6 and the common node; and a second latch comprising:

a seventh transistor (M7) having a source, a gate and a drain, wherein the drain of the M7 is coupled to the second output signal node, and wherein the gate of the M7 is coupled to the third output signal node;

an eighth transistor (M8) having a source, a gate and a drain, wherein the drain of the M8 is coupled to the fourth output signal node, and wherein the gate of the M8 is coupled to the first output signal node;

a ninth transistor (M9) having a source, a gate and a drain, wherein the drain of the M9 is coupled to the second output signal node, and wherein the gate of the M9 is coupled to the fourth output signal node;

a tenth transistor (M10) having a source, a gate and a drain, wherein the drain of the MP10 is coupled to the fourth output signal node and to the gate of the M9, and wherein the gate of the M10 is coupled to the second output signal node;

an eleventh transistor (M11) having a source, a gate and a drain, wherein the drain of the M11 is coupled to the second output signal node, and wherein the gate of the M11 is coupled to a second input signal node;

a twelfth transistor (M12) having a source, a gate and a drain, wherein the drain of the M12 is coupled to the fourth output signal node, and wherein the gate of the M12 is coupled to the gate of the M11;

a third means for blocking a static current flow between the source of the M11 and the common node; and a fourth means for blocking a static current flow between the source of the M12 and the common node.

19. The divide-by-two divider circuit of claim 18, wherein the common node is a ground node, and wherein the M5, the M6, the M11 and the M12 are N-channel transistors.

20. The divide-by-two divider circuit of claim 18, wherein the common node is a supply voltage node, and wherein the M5, the M6, the M11 and the M12 are P-channel transistors.

21. The divide-by-two divider circuit of claim 18, further comprising:
 a first capacitor having a first plate coupled to the first input signal node and having a second plate; and
 a second capacitor having a first plate coupled to the second input signal node and having a second plate.

22. The divide-by-two divider circuit of claim 21, further comprising:
 a first means for supplying a first bias voltage onto the first input signal node; and
 a second means for supplying a second bias voltage onto the second input signal node.

23. A divide-by-two divider circuit for receiving a differential input signal, wherein the differential input signal includes a first input signal and a second input signal, the divide-by-two divider circuit comprising:
 a first latching means for receiving the first input signal and for outputting a zero degrees rail-to-rail output signal 0D and a ninety degrees rail-to-rail output signal 90D, wherein the 0D has a duty cycle of approximately twenty-five percent, wherein the 90D has a duty cycle of approximately twenty-five percent, and wherein the first latching means is for consuming less than 0.7 mW when the first input signal has a frequency of at least three gigahertz such that the 0D and the 90D are output from the first latching means into loads of at least 15 fF so that each of the 0D and the 90D has a phase noise of better than 160 dBc/Hz; and
 a second latching means for receiving the second input signal and for outputting a one hundred eighty degrees output signal 180D and a two hundred seventy degrees output signal 270D, wherein the 180D has a duty cycle of approximately twenty-five percent, wherein the 270D has a duty cycle of approximately twenty-five percent, and wherein the second latching means is for consuming less than 0.7 mW when the second input signal has a frequency of at least three gigahertz such that the 180D and the 270D are output into loads of at least 15 fF so that each of the 180D and the 270D has a phase noise of better than 160 dBc/Hz.

24. The divide-by-two divider circuit of claim 23, wherein the first latching means comprises a first pair of cross-coupled P-channel transistors, and wherein the second latching means comprises a second latching pair of cross-coupled P-channel transistors.

25. The divide-by-two divider circuit of claim 23, further comprising:
 a first capacitor through which the first input signal passes to the first latching means; and
 a second capacitor through which the second input signal passes to the second latching means.

\* \* \* \* \*